(12) United States Patent
Wakabayashi et al.

(10) Patent No.: US 9,781,868 B2
(45) Date of Patent: Oct. 3, 2017

(54) PROTECTOR

(71) Applicant: SUMITOMO WIRING SYSTEMS, LTD., Mie (JP)

(72) Inventors: Masataka Wakabayashi, Mie (JP); Junya Fujita, Mie (JP); Keisuke Yagihashi, Mie (JP)

(73) Assignee: SUMITOMO WIRING SYSTEMS, LTD., Mie (JP)

(*) Notice: Subject to any disclaimer, the term of this patent is extended or adjusted under 35 U.S.C. 154(b) by 0 days.

(21) Appl. No.: 15/354,345

(22) Filed: Nov. 17, 2016

(65) Prior Publication Data

US 2017/0164528 A1    Jun. 8, 2017

(30) Foreign Application Priority Data

Dec. 7, 2015  (JP) .................. 2015-238615

(51) Int. Cl.
*H05K 1/00* (2006.01)
*H05K 9/00* (2006.01)
*H05K 1/02* (2006.01)

(52) U.S. Cl.
CPC ......... *H05K 9/0007* (2013.01); *H05K 1/0228* (2013.01); *H05K 2201/09245* (2013.01)

(58) Field of Classification Search
CPC ....... H05K 2201/09245; H05K 9/0098; H05K 1/0228
See application file for complete search history.

(56) References Cited

U.S. PATENT DOCUMENTS

| 3,757,028 | A | * | 9/1973 | Schlessel | ................. | H01B 7/08 |
| | | | | | | 174/117 FF |
| 5,679,027 | A | * | 10/1997 | Smith | .................. | H05K 1/0228 |
| | | | | | | 439/676 |
| 6,097,260 | A | * | 8/2000 | Whybrew | ............... | H01P 3/085 |
| | | | | | | 333/1 |
| 2003/0099190 | A1 | * | 5/2003 | Zerbe | ...................... | H04B 3/32 |
| | | | | | | 370/201 |

(Continued)

FOREIGN PATENT DOCUMENTS

| JP | 2003-016855 | 1/2003 |
| JP | 2015-038838 | 2/2015 |
| JP | 2015-082955 | 4/2015 |

*Primary Examiner* — Hung V Ngo
(74) *Attorney, Agent, or Firm* — Greenblum & Bernstein, P.L.C.

(57) ABSTRACT

A compact protector is unlikely to be affected by electromagnetic noise and provides excellent workability when being assembled, despite having a configuration in which twisted electrical wires are not used. The protector includes first and second plate members that respectively have a plurality of parallel slits that have a depth that is approximately half a length of wiring areas in a widthwise direction of the wiring areas. First and second linear conductors are respectively supported by the first and second plate members such that the first and second linear conductors have an approximately wave-like shape that is bent in a lengthwise direction, a widthwise direction, and a thickness direction of the first and second plate members. The first and second plate members are laterally fitted to each other such that respective bottom parts of each pair of parallel slits that face each other are brought close to each other.

3 Claims, 10 Drawing Sheets

(56) References Cited

U.S. PATENT DOCUMENTS

| | | | |
|---|---|---|---|
| 2003/0231533 A1* | 12/2003 | Honda | G11B 20/24 365/200 |
| 2004/0256149 A1* | 12/2004 | Kuan | H05K 1/0245 174/262 |
| 2006/0108694 A1* | 5/2006 | Hung | H01L 23/49838 257/773 |
| 2010/0200276 A1* | 8/2010 | Karikalan | H05K 1/0245 174/250 |
| 2015/0015345 A1* | 1/2015 | Sasaki | H01P 3/08 333/238 |
| 2016/0037691 A1* | 2/2016 | Kroushl | H05K 9/0086 428/43 |

* cited by examiner

PROTECTOR

CROSS-REFERENCE TO RELATED APPLICATIONS

The present application claims priority under 35 U.S.C. §119 of Japanese Application No. 2015-238615, filed on Dec. 7, 2015, the disclosure of which is expressly incorporated by reference herein in its entirety.

TECHNICAL FIELD

The present invention relates to a protector that prevents the influence of electromagnetic noise.

BACKGROUND ART

In recent years, vehicles are equipped with various kinds of electronic devices, sensors, and a plurality of electronic control units (ECUs) for controlling the electronic devices and the sensors. In order to prevent external electromagnetic noise from entering signal lines that connect the electronic devices, the sensors, and the ECUs, or signal lines that connect the ECUs, various measures have been taken (for example, see JP2015-038838A and JP 2003-016855A).

JP 2015-038838A discloses a wire harness provided with twisted pair wires composed of two electrical wires that are spirally twisted together. A holder made of photocurable resin is brought into intimate contact with the two electrical wires so as to restrict their relative displacement (FIG. 1, paragraphs 0002 and 0008). This configuration prevents a phenomenon in which the twisted electrical wires come undone, the distance between the electrical wires increases, and the noise reduction effect decreases.

JP 2003-016855A discloses a flat circuit member for shielding that is formed by arranging first and second paired circuit conductors having a wave-like symmetrical shape side by side or stacking them, on an insulation sheet. Noise generated between the two paired circuit conductors is reduced by, for example, setting the meandering pitch of one of the paired circuit conductors to be an odd multiple or an even multiple of that of the other (FIG. 1, paragraphs 0020 and 0023).

Meanwhile, a tube-shaped protector that is made of synthetic resin and is fitted onto a wire harness including signal lines is also often used to protect the signal lines that are routed in a vehicle, from suffering damage such as a break or an insulation failure (for example, see JP 2015-082955A).

JP 2015-082955A discloses a protector for a wire harness, in which a resin plate having the ability to maintain its shape in a three-dimensionally folded state is used as a substrate. This substrate has a rectangular shape, and is to be formed into a rectangular tube shape having a hollow space that allows a set of electrical wires for the wire harness to pass therethrough, by folding the substrate along three lines located at intervals in the width direction such that the folded sections are parallel with each other along the entire length in the lengthwise direction (see FIG. 3, paragraph 0007).

JP 2015-038838A, JP 2003-016855A, and JP 2015-082955A are examples of related art.

SUMMARY OF THE INVENTION

Technical Problem

However, if a protector as disclosed in JP 2015-082955A is used for a wire harness in which twisted pair wires are used as disclosed in JP 2015-038838A, it is necessary to first form twisted pair wires by twisting electrical wires together, then attach the twisted pair wires to the protector using an adhesive tape, and form the protector into a rectangular tube shape. This process is troublesome and work efficiency is poor.

Also, the flat circuit member for shielding as disclosed in JP 2003-016855A has a problem in which the width increases as the number of signal lines increases if the paired circuit conductors are arranged side by side. Also, if the paired circuit conductors are stacked, the number of layers increases as the number of signal lines increases, which leads to a complex structure.

The present invention has been made to solve the above-described problems, and aims to provide a compact protector that is unlikely to be affected by electromagnetic noise and that provides excellent workability when being assembled, despite having a configuration in which twisted electrical wires are not used.

Solution to Problem

To fulfill the above-described aim, a protector according to one aspect of the present invention includes first and second plate members that respectively have: wiring areas that are approximately rectangular; first and second linear conductors that are respectively laid on the wiring areas; and sets of a plurality of parallel slits that are located at intervals in a lengthwise direction of the wiring areas and that have a depth that is approximately half a length of the wiring areas in a widthwise direction of the wiring areas. The first and second linear conductors are respectively supported by the first and second plate members such that the first and second linear conductors have an approximately wave-like shape that is bent in a lengthwise direction, a widthwise direction, and a thickness direction of the first and second plate members, and when the first and second plate members are laterally fitted to each other such that respective bottom parts of each pair of parallel slits that face each other are brought close to each other, and such that the first and second plate members alternatingly face each other in opposite directions along a plate thickness direction at positions on two sides of the pair of parallel slits in the lengthwise direction of the wiring areas, the first and second linear conductors in plan view of the wiring areas that overlap each other have: first loop sections that constitute a plurality of loops corresponding to the wave-like shape of the first and second linear conductors; and second loop sections that constitute a plurality of loops corresponding to the wave-like shape of the first and second linear conductors and are formed along lateral cross sections of the first and second plate members.

With this configuration, in the protector according to this aspect of the present invention, when the first and second plate members are laterally fitted to each other, the first and second linear conductors in plan view have first loop sections that constitute a plurality of loops corresponding to the wave-like shape of the first and second linear conductors. These loops are configured such that induced currents that pass along the loops cancel out each other when a magnetic flux is generated in the direction that penetrates through the loops. With this configuration, a protector 1 is resistant to electromagnetic noise that is generated in the direction that penetrates through the first and second plate members at a right angle. Also, when the first and second plate members are laterally fitted to each other, the second loop sections that constitute a plurality of loops are formed along the lateral cross sections of the first and second plate members. These loops are configured such that induced currents that pass along the loops cancel out each other when a magnetic flux is generated in the direction that penetrates through the loops. With this configuration, the protector 1 is resistant to electromagnetic noise that is generated in the lengthwise direction of the first and second plate members. Also, workability at the time of assembly is excellent because it is easy to assemble the first and second plate members by laterally fitting them to each other. Furthermore, it is possible to realize a compact protector by constituting each of the first and second linear conductors using a plurality of wire-shaped conductors.

The first and second linear conductors may be constituted by band-shaped conductors that are respectively fixed to the first and second plate members.

With this configuration, in the protector according to this aspect of the present embodiment, band-shaped conductors are respectively fixed to the first and second plate members. Therefore, unlike in the case of laying electrical wires, the first and second linear conductors do not become separated from the first and second plate members, and workability at the time of assembly can be further improved. Also, since the wave-shaped routes along which the first and second linear conductors meander are fixed, it is unnecessary to manually carry out wiring, and the ability to tolerate noise can be stably achieved.

In the protector according to this aspect of the present invention, the first and second linear conductors may be constituted by coated electrical wires that are respectively held by the first and second plate members.

With this configuration, in the protector according to this aspect of the present invention, the coated electrical wires are held by the first and second plate members. Therefore, if the coated electrical wires are broken or damaged, it is only necessary to replace the broken or damaged coated electrical wires. Therefore, it is possible to address a failure, such as a broken wire, at a low cost.

Advantageous Effects of Invention

The present invention can provide a compact protector that is unlikely to be affected by electromagnetic noise and that provides excellent workability when being assembled, despite having a configuration in which twisted electrical wires are not used.

BRIEF DESCRIPTION OF DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DESCRIPTION OF EMBODIMENTS

Figure 1:
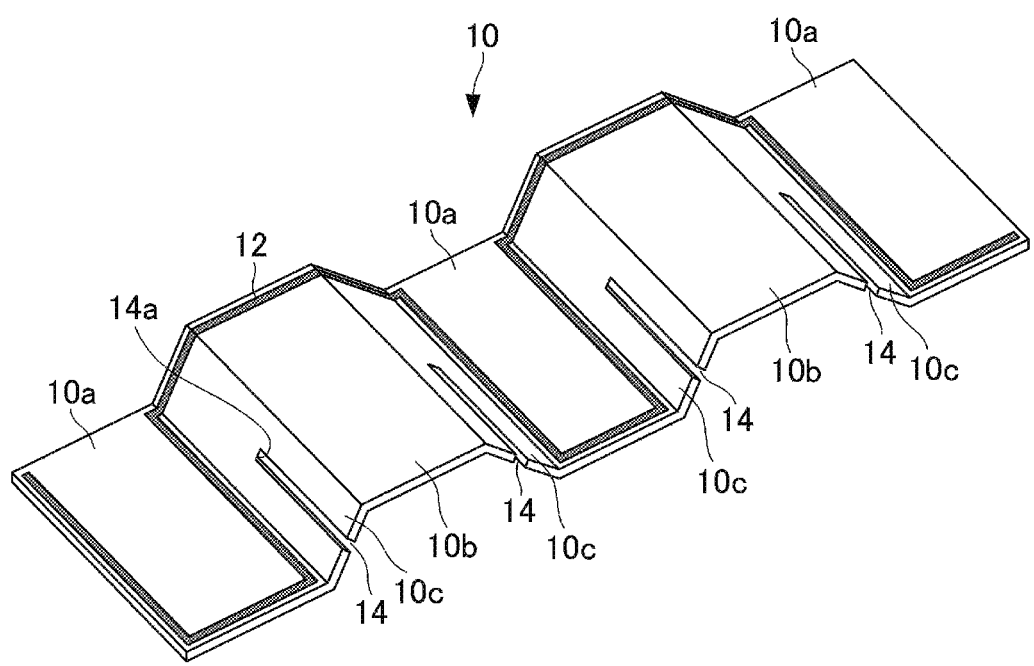
FIG. 1 is a perspective view of a first plate member according to an embodiment of the present invention.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the forms of the present invention may be embodied in practice. The following describes an embodiment of a protector according to one aspect of the present invention with reference to the drawings.

Configuration

A protector 1 according to the present embodiment includes a first plate member 10 and a second plate member 20. The first plate member 10 and the second plate member 20 respectively have: wiring areas 16 and 26 that are approximately rectangular; a first linear conductor 12 and a second linear conductor 22 that are respectively laid on the wiring areas 16 and 26; and a plurality of parallel slits 14 and a plurality of parallel slits 24 that are respectively located at intervals in the lengthwise direction of the wiring areas 16 and 26 and that have a depth that is approximately half the length of the wiring areas 16 and 26 in the widthwise direction.

The first plate member 10 is made of a synthetic resin such as polypropylene (PP), polybutylene terephthalate (PBT), polyvinyl chloride (PVC), or polyethylene (PE), and is formed as an integrally molded part.

Figure 7:
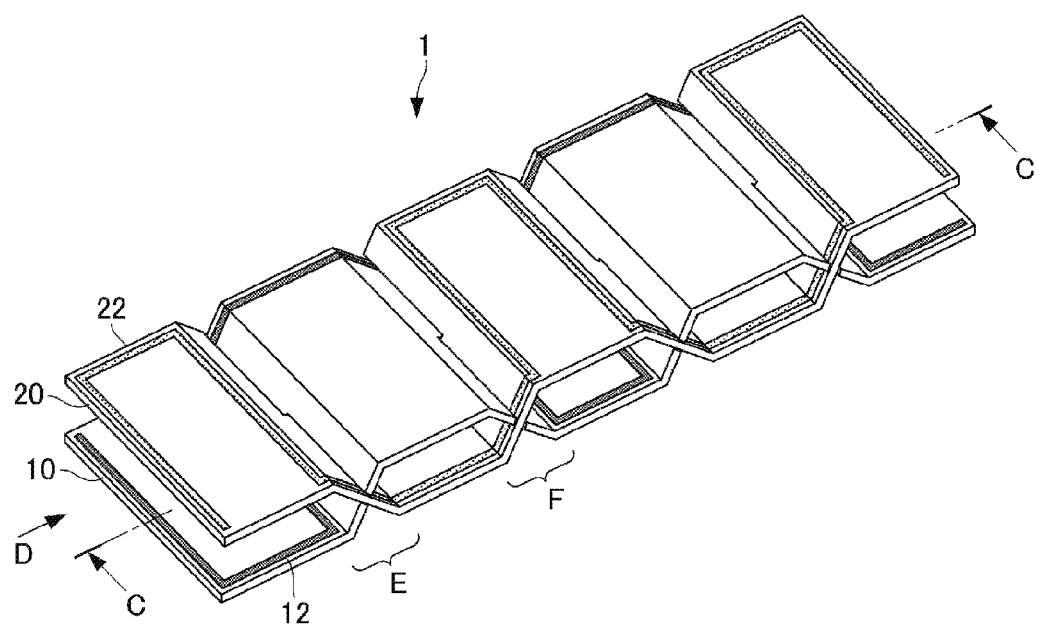
FIG. 7 is a perspective view showing a situation in which the first plate member and the second plate member have been assembled according to an embodiment of the present invention.

Specifically, as shown in FIG. 1, the first plate member 10 includes: lower plate parts 10a that are rectangular; and upper plate parts 10b that are rectangular and located at a predetermined height from the lower plate parts 10a. The lower plate parts 10a and the upper plate parts 10b are alternatingly arranged, and coupling plate parts 10c that are rectangular and inclined couple a lower plate part 10a and an upper plate part 10b with each other. The lower plate parts 10a and the upper plate parts 10b that are rectangular have the same width, whereas their lengths may be the same or different. For example, in plan view of the first plate member 10 shown in FIG. 2, the length of the lower plate parts 10a may be larger than the length of the upper plate parts 10b such that the meandering pitch of the first linear conductor 12 is uniform. Such a configuration is preferable in terms of cancelling out the influence of electromagnetic noise because loops having the same shape in plan view are formed when the first plate member 10 and the second plate member 20 are assembled as shown in FIG. 7.

Figure 3:
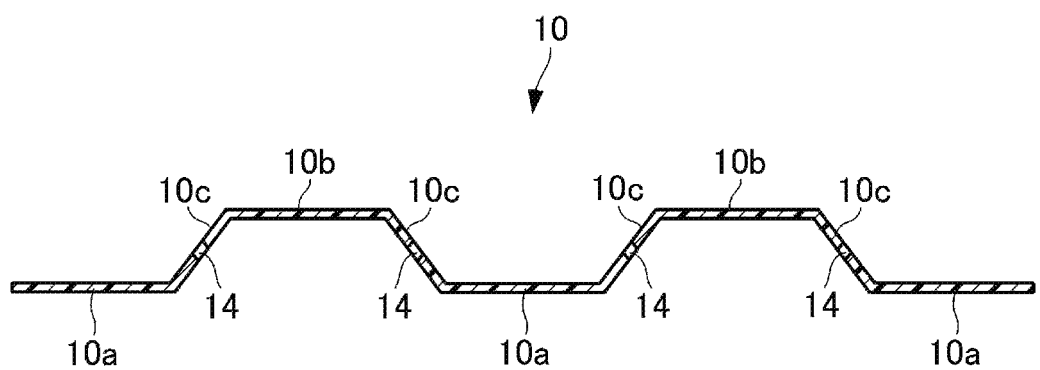
FIG. 3 is a cross-sectional view of the first plate member shown in FIG. 2 along a line A-A.

The inclination angle of the inclined coupling plate parts 10c may be set freely. It is preferable that the inclination angle is set to 45° as shown in FIG. 3 because the coupling plate parts 10c and the coupling plate parts 20c intersect at a right angle when assembled and it is therefore easy to assemble them. If the inclination angle is set to 90° for example, the second plate member 20, which serves as the counterpart of the first plate member 10, can be flat, and it is easy to manufacture the second plate member 20.

The first linear conductor 12 and the second linear conductor 22 are respectively supported by the first plate member 10 and the second plate member 20 such that the first linear conductor 12 and the second linear conductor 22 have an approximately wave-like shape that is bent in the lengthwise direction, the widthwise direction, and the thickness direction of the first plate member 10 and the second plate member 20.

Figure 2:
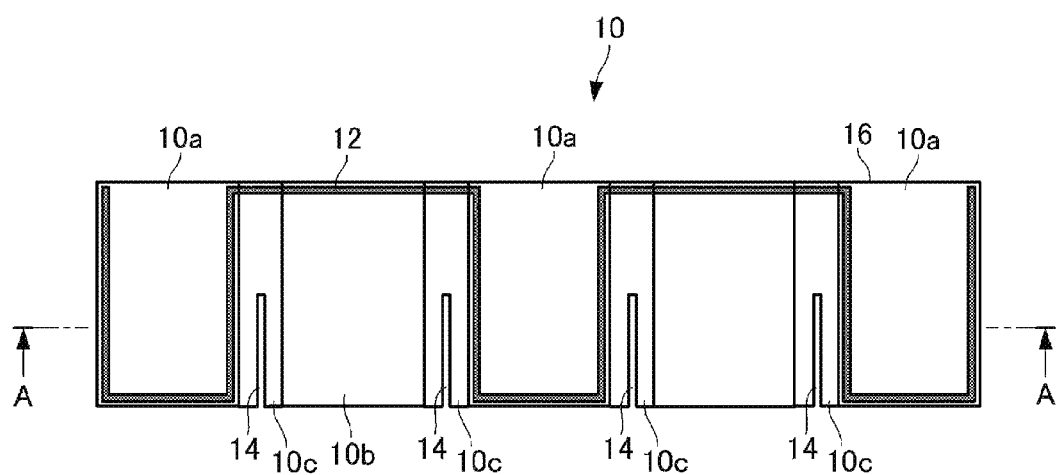
FIG. 2 is a plan view of the first plate member shown in FIG. 1.

Specifically, as shown in FIG. 2, the first linear conductor 12 is first laid on a lower plate part 10a in a squared U shape along the periphery of the lower plate part 10a, is next laid along an edge of an upwardly-inclined coupling plate part 10c on the side where the parallel slit 14 is not formed, and is then laid along an edge of an upper plate part 10b and an edge of a downwardly-inclined coupling plate part 10c. From the subsequent lower plate part 10a, the aforementioned wiring pattern is repeatedly applied.

The first linear conductor 12 and the second linear conductor 22 each include one or more signal lines (wire-shaped conductor). One of the first linear conductor 12 and the second linear conductor 22 is positive, and the other is negative. Here, note that positive signal lines are signal lines that transmit signals by allowing electrical current to pass therethrough in one predetermined direction, and negative signal lines are signal lines that transmit signals by allowing electrical current to pass therethrough in a direction that is opposite the direction in which electrical current passes through the positive signal lines. Therefore, in the one or more signal lines that constitute the first linear conductor 12, electrical current passes in one predetermined direction during signal transmission, and in the one or more signal lines that constitute the second linear conductor 22, electrical current passes in the direction opposite the predetermined direction during signal transmission.

The first linear conductor 12 and the second linear conductor 22 are constituted by band-shaped conductors that are respectively fixed to the first plate member 10 and the second plate member 20. The first linear conductor 12 and the second linear conductor 22 may be formed by applying a metal thin film coating onto the first plate member 10 and the second plate member 20, using vapor deposition or ion plating technology, for example. After the first linear conductor 12 and the second linear conductor 22 have been formed by thin film coating, it is preferable that a protection sheet made of PVC, PE, or the like is attached to the first linear conductor 12 and the second linear conductor 22 from above.

Next, the second plate member 20 will be described.

Figure 4:
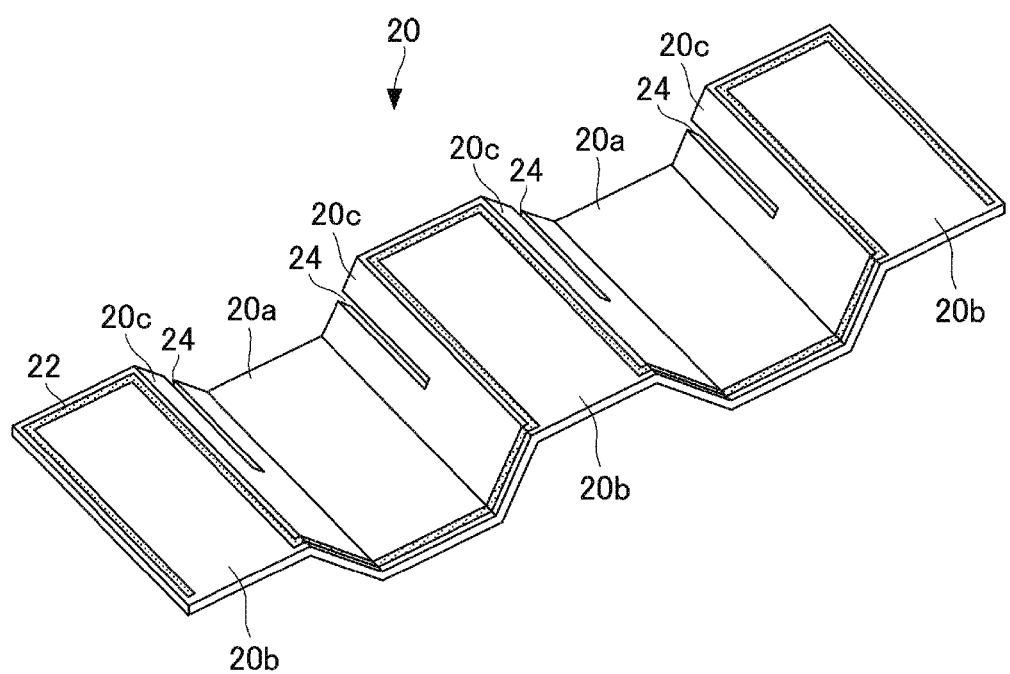
FIG. 4 is a perspective view of a second plate member according to an embodiment of the present invention.

As shown in FIG. 4, the second plate member 20 includes: lower plate parts 20a that are rectangular; and upper plate parts 20b that are rectangular and located at a predetermined height from the lower plate parts 20a. The lower plate parts 20a and the upper plate parts 20b are alternatingly arranged, and coupling plate parts 20c that are rectangular and inclined couple a lower plate part 20a and an upper plate part 20b with each other. The lower plate parts 20a and the upper plate parts 20b that are rectangular have the same width, whereas their lengths are set in correspondence with the length of the first plate member 10. For example, in plan view of the second plate member 20 shown in FIG. 5, the length of the upper plate parts 20b may be larger than the length of the lower plate parts 20a such that the meandering pitch of the second linear conductor 22 is uniform. Such a configuration is preferable in terms of cancelling out the influence of electromagnetic noise because loops having the same shape in plan view are formed when the first plate member 10 and the second plate member 20 are assembled as shown in FIG. 7.

Figure 6:
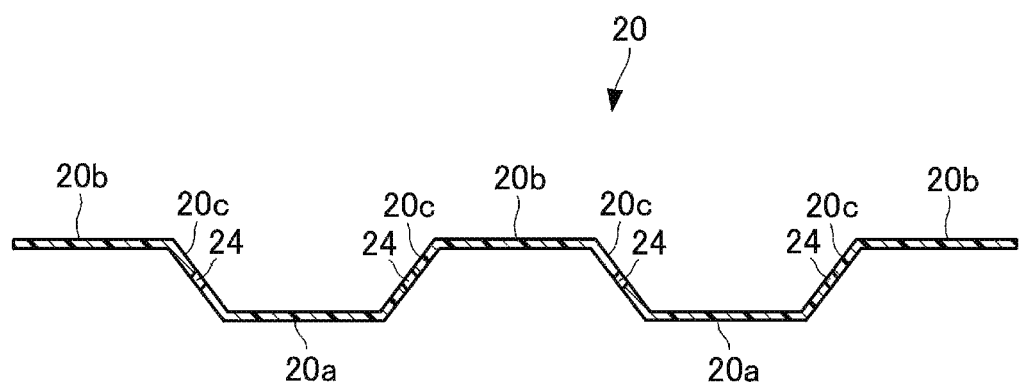
FIG. 6 is a cross-sectional view of the second plate member shown in FIG. 5 along a line B-B.

The inclination angle of the inclined coupling plate parts 20c may be set freely. However, it is preferable that the inclination angle is set in correspondence with the inclination angle of the coupling plate parts 10c of the first plate member 10 that serves as the counterpart of the second plate member 20. It is preferable that the inclination angle is set to 45° as shown in FIG. 6 because the coupling plate parts 10c and the coupling plate parts 20c intersect at a right angle when assembled and it is therefore easy to assemble them. If the inclination angle is set to 90° for example, the first plate member 10 that serves as the counterpart of the second plate member 20 can be flat, and it is easy to manufacture the first plate member 10.

Figure 5:
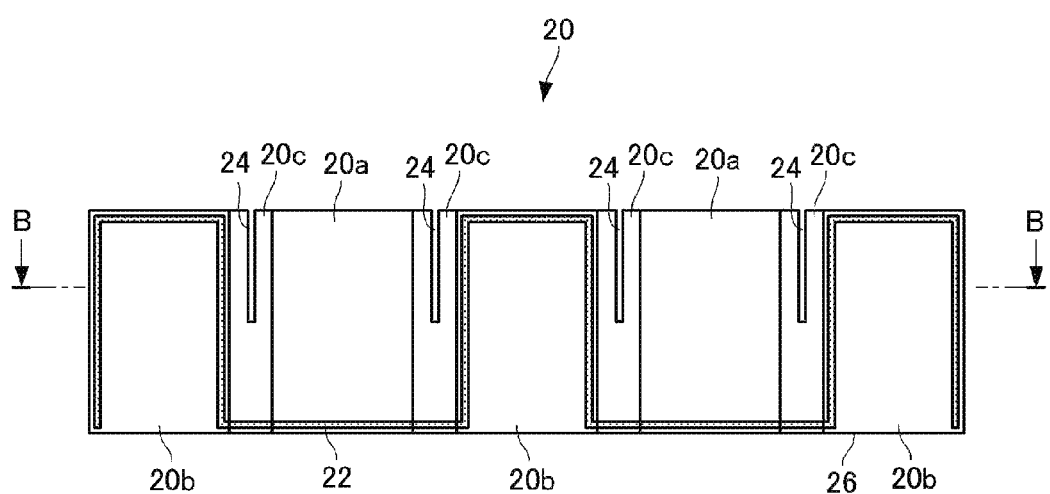
FIG. 5 is a plan view of the second plate member shown in FIG. 4.

As shown in FIG. 5, the second linear conductor 22 is first laid on an upper plate part 20b in a squared U shape along the periphery of the upper plate part 20b, is next laid along an edge of a downwardly-inclined coupling plate part 20c on the side where the parallel slit 24 is not formed, and is then laid along an edge of a lower plate part 20a and an edge of an upwardly-inclined coupling plate part 20c. From the subsequent upper plate part 20b, the aforementioned wiring pattern is repeatedly applied.

Next, a method for assembling the first plate member 10 and the second plate member 20 will be described.

The first plate member 10 and the second plate member 20 are assembled as follows. The first plate member 10 and the second plate member 20 are laterally fitted to each other such that bottom parts 14a and 24a of each pair of parallel slits 14 and 24 that face each other are brought close to each other, and such that the first plate member 10 and the second plate member 20 alternatingly face each other in opposite directions along the plate thickness direction on two sides of the pair of parallel slits 14 and 24 in the lengthwise direction of the wiring areas 16 and 26.

Specifically, the first plate member 10 and the second plate member 20 are brought close to each other such that the side face of the first plate member 10 on the parallel slits 14 side shown in FIG. 1 and the side face of the second plate member 20 on the parallel slits 24 side shown in FIG. 4 face each other, and then the first plate member 10 is fitted into the parallel slits 24 that face thereto and the second plate member 20 is fitted into the parallel slits 14 that face thereto. Assembly is complete when the first plate member 10 and the second plate member 20 are fitted to the bottom parts 14a and 24a of the parallel slits 14 and 24 (see FIG. 7). As described above, since the first plate member 10 and the second plate member 20 can be assembled by laterally fitting them to each other, it is easy to assemble them. Also, it is possible to assemble them even if a connector is attached to the first linear conductor 12 and the second linear conductor 22 or ends portions of electrical wires that are connected to the first linear conductor 12 and the second linear conductor 22.

Next, the influence of electromagnetic noise will be described.

Figure 8:
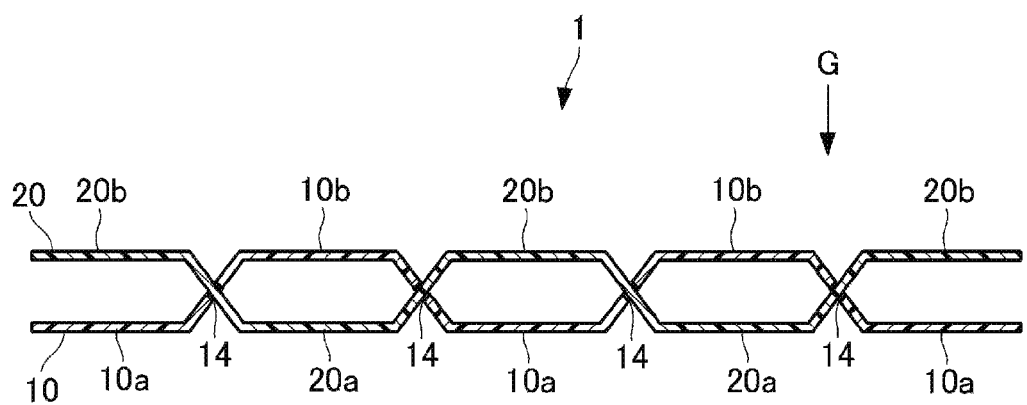
FIG. 8 is a cross-sectional view of the assembly shown in FIG. 7 along a line C-C.

First, when the first plate member 10 and the second plate member 20 are laterally fitted to each other, the first linear conductor 12 and the second linear conductor 22 in plan view (when the protector 1 is seen in a direction G shown in FIG. 8) form first loop sections that constitute a plurality of loops corresponding to the wave-like shape of the first linear conductor 12 and the second linear conductor 22. These loops are configured such that induced currents that pass along the loops cancel out each other when a magnetic flux is generated in the direction that penetrates through the loops (the direction G shown in FIG. 8 or the opposite direction). With this configuration, the protector 1 is resistant to electromagnetic noise that is generated in the direction that penetrates through the first plate member 10 and the second plate member 20 at a right angle.

When the first plate member 10 and the second plate member 20 are assembled by being laterally fitted to each other, the first linear conductor 12 and the second linear conductor 22 form second loop sections that constitute a plurality of loops corresponding to the wave-like shape of the first linear conductor 12 and the second linear conductor 22 and are formed along the lateral cross sections of the first plate member 10 and the second plate member 20.

Figure 9A:
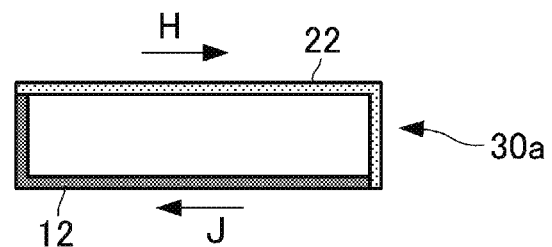
FIG. 9A is a diagram illustrating a loop in a second loop section of a first and second linear conductors when a part E in FIG. 7 is seen in a direction D.
Figure 9B:
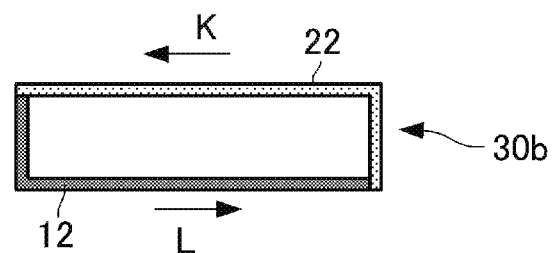
FIG. 9B is a diagram illustrating a loop in a second loop section of the first and second linear conductors when a part F in FIG. 7 is seen in the direction D.

Specifically, FIG. 9A is a diagram illustrating a loop 30a that is formed by the first linear conductor 12 and the second linear conductor 22 when a part E shown in FIG. 7 is seen in the direction D, and FIG. 9B is a diagram illustrating a loop 30b that is formed by the first linear conductor 12 and the second linear conductor 22 when a part F shown in FIG. 7 is seen in the direction D. Here, it is assumed that a magnetic flux that varies over time exists along the direction D shown in FIG. 7. If this is the case, even if electromotive forces that cause electrical currents to flow in the directions indicated by arrows H and J are induced in the first linear conductor 12 and the second linear conductor 22 due to variation in the magnetic flux that penetrates through the loop 30a in the part E, the directions of these electromotive forces are opposite the directions of electromotive forces (indicated by arrows K and L) that are induced due to variation in the magnetic flux that penetrates through the loop 30b in the part F, and the induced electromotive forces are cancelled out. Therefore, the protector 1 with this configuration is unlikely to be affected by electromagnetic noise generated in the lengthwise direction of the first plate member 10 and the second plate member 20.

Actions and Advantageous Effects

In the protector 1 according to the present embodiment, when the first plate member 10 and the second plate member 20 are laterally fitted to each other, the second loop sections that constitute a plurality of loops are formed along the lateral cross sections of the first plate member 10 and the second plate member 20 (see FIGS. 9A and 9B). These loops are configured such that induced currents that pass along the loops cancel out each other when a magnetic flux that penetrates through the loops in the lengthwise direction of the protector 1 is generated. With this configuration, the protector 1 is resistant to electromagnetic noise that is generated in the lengthwise direction of the first plate member 10 and the second plate member 20. Also, workability at the time of assembly is excellent because it is easy to assemble the first plate member 10 and the second plate member 20 by laterally fitting them to each other.

Also, in the protector 1 according to the present embodiment, band-shaped conductors are respectively fixed to the first plate member 10 and the second plate member 20. Therefore, unlike in the case of laying electrical wires, the first linear conductor 12 and the second linear conductor 22 do not become separated from the first plate member 10 and the second plate member 20, and workability at the time of assembly can be further improved. Also, since the wave-shaped routes along which the first linear conductor 12 and the second linear conductor 22 meander are fixed, it is unnecessary to manually carry out wiring, and the ability to tolerate noise can be stably achieved.

Another Embodiment

Next, another embodiment will be described.

Figure 10:
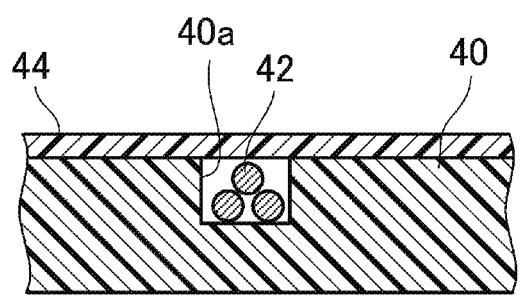
FIG. 10 is a partial cross-sectional view of a first plate-shaped member according to another embodiment of the present invention.

The first linear conductor 12 and the second linear conductor 22 according to the present embodiment are each constituted by one or more coated electrical wires 42 that are held by a first or a second plate member 40. For example, as shown in FIG. 10, grooves 40a for wiring may be respectively formed in the surfaces of the first and second plate members 40 along signal routes, and the coated electrical wires 42 may be laid in the grooves 40a. After the coated electrical wires 42 are laid, it is preferable that a protection sheet 44 made of PVC, PE, or the like is attached to the coated electrical wires 42 from above in order to hold and protect the coated electrical wires 42. The grooves 40a for wiring may be configured by forming recesses in the surfaces of the first and second plate members 40, or by forming guide walls that project from the surfaces.

In the protector 1 according to the present embodiment, the coated electrical wires 42 are held by the first and second plate members 40. Therefore, if the coated electrical wires 42 are broken or damaged, it is only necessary to replace the coated electrical wires alone. Thus, if a failure such as a broken wire occurs, it is possible to repair the protector at a low cost.

As described above, the protector according to one aspect of the present invention achieves the advantageous effects of being unlikely to be affected by electromagnetic noise, providing excellent workability when being assembled, and being compact, despite having a configuration in which twisted pair wires are not used, and is applicable to general protectors that are used in an environment in which electromagnetic noise exists.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

The invention claimed is:

1. A protector comprising:
   first and second plate members having wiring areas that are substantially rectangular, and a plurality of parallel slits located at intervals in a length direction of the wiring areas and having a depth that is approximately half a length of the wiring areas in a width direction of the wiring areas, a first linear conductor supported on the wiring areas of the first plate member, and a second linear conductor supported on the wiring areas of the second plate member,
   wherein the first and second linear conductors are respectively supported by the first and second plate members such that the first and second linear conductors have a substantially wave shape that is bent in a length direction, a width direction, and a thickness direction of the first and second plate members, wherein the first and second plate members are laterally fitted to each other such that respective bottom parts of each pair of parallel slits that face each other are brought close to each other, and such that the first and second plate members alternatingly face each other in opposite directions along a plate thickness direction at positions on two sides of the pair of parallel slits in the length direction of the wiring areas, and wherein the first and second linear conductors in plan view of the wiring areas that overlap each other have: first loop sections that constitute a plurality of loops corresponding to the wave shape of the first and second linear conductors; and second loop sections that constitute a plurality of loops corresponding to the wave shape of the first and second linear conductors and are formed along lateral cross sections of the first and second plate members.

2. The protector according to claim 1,
wherein the first and second linear conductors are band-shaped conductors that are respectively fixed to the first and second plate members.

3. The protector according to claim 1,
wherein the first and second linear conductors are coated electrical wires that are respectively held by the first and second plate members.

* * * * *